(12) United States Patent
Ju

(10) Patent No.: US 7,731,507 B1
(45) Date of Patent: Jun. 8, 2010

(54) ELECTRIC CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/377,198

(22) Filed: Mar. 17, 2006

(51) Int. Cl.
*H01R 12/00* (2006.01)
(52) U.S. Cl. .............................. 439/71; 439/83; 439/66; 439/264; 439/330; 439/525; 439/526 H
(58) Field of Classification Search ................... 439/83, 439/70–71, 264, 330, 525, 526
See application file for complete search history.

(56) References Cited

U.S. PATENT DOCUMENTS 6,494,725 B2 * 12/2002 Lin et al. ...................... 439/83

* cited by examiner

*Primary Examiner*—Truc Nguyen
(74) *Attorney, Agent, or Firm*—Jackson IPG PLLC

(57) ABSTRACT

An electric connector is disclosed to include an electrically insulative housing, which has solder ball receiving portions, terminals respectively mounted in the housing corresponding to the solder ball receiving portions, each terminal having an endpiece, which defines with the sidewall of each of the solder ball receiving portions a respective receiving chamber, and solder balls respectively movably accommodated in the receiving chambers defined by the endpieces of the terminals and the sidewalls of the solder ball receiving portions.

13 Claims, 2 Drawing Sheets

ELECTRIC CONNECTOR

BACKGROUND OF THE INVENTION (a) Field of the Invention

The present invention relates to an electric connector and more particularly, to an electric connector with solder balls.

(b) Description of the Prior Art

Conventionally, the connection between an electric connector and a circuit board can be done in two ways. One way is to directly solder the pins of the electric connector to the circuit board. The other way is to bond the terminals of the electric connector to the circuit board by means of a solder material. China Patent #2004200 59350.7 discloses an electric connector with solder balls. According to this design, the electric connector comprises a housing and a number of terminals. The housing has a plurality of terminal slots and a plurality of bottom solder ball grooves respectively disposed in communication with the terminal slots. The terminals are respectively mounted in the terminal slots, each having a protruding portion. Further, solder balls are respectively mounted in the bottom solder ball grooves and fixedly connected to the protruding portions of the terminals. According to this design, the bottom solder ball grooves extend in vertical direction, therefore the solder balls may easily be forced away from the bottom solder ball grooves. Although the protruding portions of the terminals are respectively engaged into the solder balls to hold the solder balls in place, however it is difficult to control the solder balls at the same elevation.

Therefore, it is desirable to provide an electric connector that eliminates the aforesaid drawbacks.

SUMMARY OF THE INVENTION

The present invention has been accomplished under the circumstances in view. It is one object of the present invention to provide an electric connector, which is easy to manufacture and assures a high bonding quality.

To achieve this and other objects of the present invention, the electric connector comprises electric connector comprising an electrically insulative housing, a plurality of terminals, and a plurality of solder balls. The housing has a plurality of terminal slots and a plurality of solder ball receiving portions corresponding to the terminal slots. The terminals are respectively mounted in the terminal slots. The solder balls are respectively accommodated in the solder ball receiving portions. The solder ball receiving portions each have a sidewall. The terminals each have an endpiece respectively defining with the sidewalls of the solder ball receiving portions a respective receiving chamber. The solder balls are respectively movably accommodated in the receiving chambers defined by the endpieces of the terminals and the sidewalls of the solder ball receiving portions.

DETAILED DESCRIPTION OF THE PREFERRED EMBODIMENTS

Figure 1:
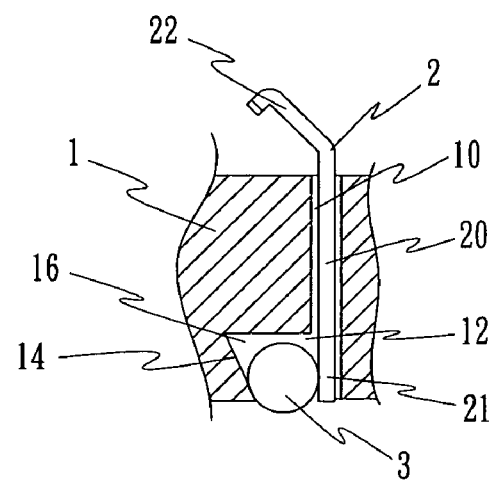
FIG. 1 is a schematic sectional view of an electric connector in accordance with a first embodiment of the present invention.

Referring to FIG. 1, an electric connector in accordance with a first embodiment of the present invention is shown comprised of an electrically insulative housing 1 and a plurality of terminals 2 (only one terminal is shown in FIG. 1). The housing 1 has a plurality of terminal slots 10 (only one terminal slot is shown in FIG. 1). The terminal slots 10 can be arranged in an array. The terminals 2 are respectively mounted in the terminal slots 10, each having a body 20, a vertical stop portion 21 vertically downwardly extending from one side, namely, the bottom side of the body 20, and a contact portion 22 upwardly extending from the other side, namely, the top side of the body 20 for the connection of an external electronic device. The housing 1 further has a plurality of solder ball receiving means. According to this embodiment, the solder ball receiving means are solder ball receiving holes 12 arranged on the middle of the housing 1 in communication with the terminal slots 10. Each solder ball receiving hole 12 has a sloping sidewall 14. The stop portion 21 of each terminal 2 blocks a part of the opening of the associating solder ball receiving hole 12, therefore the stop portion 21 define with the sloping sidewall 14 of the associating solder ball receiving hole 12 a receiving chamber 16 in which the associating ball 3 is movably received.

When holding the electric connector in vertical for bonding to a circuit board (not shown), the solder balls 3 are forced by the respective gravity weight to move to the lower limit position in the respective receiving chambers 16, and therefore the solder balls 3 are kept at the same elevation for bonding to the circuit board, assuring a high bonding quality.

Figure 2:
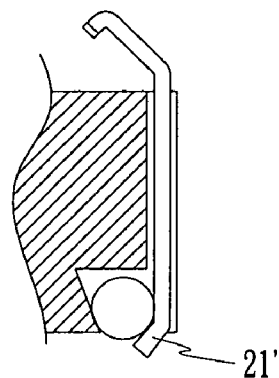
FIG. 2 is a schematic sectional view of an electric connector in accordance with a second embodiment of the present invention.

FIG. 2 shows an electric connector in accordance with a second embodiment of the present invention. This embodiment is substantially similar to the aforesaid first embodiment with the exception that the stop portion 21' of each terminal is an oblique stop portion obliquely extending from the bottom side of the body of the respective terminal. This embodiment achieves the same effect.

Figure 3:
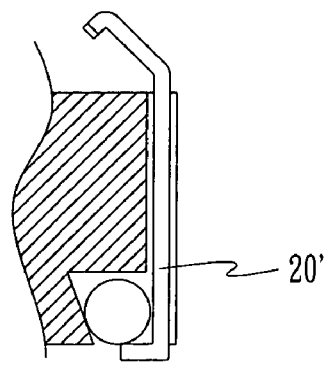
FIG. 3 is a schematic sectional view of an electric connector in accordance with a third embodiment of the present invention.

FIG. 3 shows an electric connector in accordance with a third embodiment of the present invention. This embodiment is substantially similar to the aforesaid second embodiment with the exception that the stop portion of each terminal extends from the bottom side of the body 20' of the respective terminal at right angles toward the oblique sidewall of the associating solder ball receiving hole. This embodiment achieves the same effect.

Figure 4:
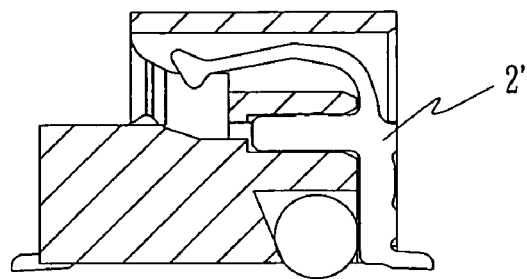
FIG. 4 is a schematic sectional view of an electric connector in accordance with a fourth embodiment of the present invention.

FIG. 4 shows an electric connector in accordance with a fourth embodiment of the present invention. This embodiment is substantially similar to the aforesaid first embodiment with the exception that the bottom end of each terminal 2' extends outwards in horizontal convenient for bonding to a circuit board. This embodiment achieves the same effect.

Figure 5:
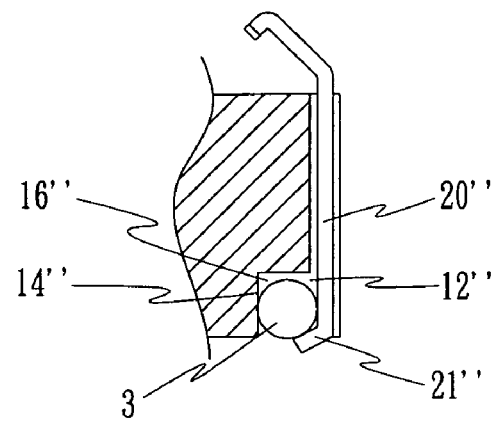
FIG. 5 is a schematic sectional view of an electric connector in accordance with a fifth embodiment of the present invention.

FIG. 5 shows an electric connector in accordance with a fifth embodiment of the present invention. According to this embodiment, the sidewall 14"; the stop portion 21" of each terminal extends obliquely downwards from the bottoms die of the body 20" of the respective terminal toward the vertical sidewall 14" and defining with the vertical sidewall 14" of the associating solder ball receiving hole 12" a receiving chamber 16" within which the associating solder ball 3 is movably received. This embodiment achieves the same effect.

Figure 6:
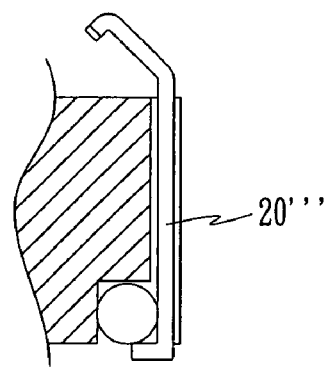
FIG. 6 is a schematic sectional view of an electric connector in accordance with a sixth embodiment of the present invention.

FIG. 6 shows an electric connector in accordance with a sixth embodiment of the present invention. This embodiment is substantially similar to the aforesaid fifth embodiment with the exception that the stop portion of each terminal extends from the bottom side of the body of the respective terminal at right angles, i.e., the stop portion extends in horizontal. This embodiment achieves the same effect.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An electric connector comprising:
   a) an electrically insulative housing having:
      i) a plurality of terminal slots; and
      ii) a plurality of solder ball receiving portions;
   b) a plurality of terminals, one of the plurality of terminals is inserted into each of the plurality of terminal slots; each of the plurality of terminals having:
      i) a contact portion located on a first en thereof;
      ii) a stop portion located on a second end thereof;
      iii) a body located between the contact portion and the stop portion; and
   c) a plurality of solder balls, one of the plurality of solder balls is movably inserted into each of the plurality of solder ball receiving portions, wherein a side wall of a corresponding one of the plurality of solder ball receiving portions and the stop portion of a corresponding terminal of the plurality of terminals defining a receiving chamber and securing a corresponding solder ball of the plurality of solder balls in the receiving chamber.

2. The electric connector as claimed in claim 1, wherein the sidewall of each said solder ball receiving portion is an oblique wall.

3. The electric connector as claimed in claim 1, wherein the sidewall of each of said solder ball receiving portion is a vertical wall.

4. The electric connector as claimed in claim 1, wherein the endpiece of each of said terminals extends horizontally outwards in reverse to the sidewall of the associating solder ball receiving portion.

5. The electric connector as claimed in claim 1, wherein said solder ball receiving portions are receiving holes formed on a middle part of said housing.

6. The electric connector as claimed in claim 1, wherein said solder ball receiving portions are receiving holes formed on an outside wall of said housing.

7. The electric connector as claims in claim 1, wherein the endpiece of each of said terminals terminating in a stop portion that partially blocks the associating solder ball receiving portion.

8. The electric socket as claimed in claim 2, wherein the endpiece of each of said terminal extends vertically.

9. The electric connector as claimed in claim 2, wherein the endpiece extends from the respective terminal toward the sidewall of the associating solder ball receiving portion at an angle.

10. The electric connector as claimed in claim 3, wherein the endpiece extends from the respective terminal toward the sidewall of the associating solder ball receiving portion at an angle.

11. The electric connector according to claim 3, wherein each corresponding solder ball of the plurality of solder balls is located between a top wall of the corresponding one of the plurality of solder ball receiving portions, the side wall of the of the corresponding one of the plurality of solder ball receiving portions, and the stop portion of the corresponding terminal of the plurality of terminals.

12. The electric connector as claimed in claim 9, wherein the endpiece of each of said terminals extends in horizontal.

13. The electric connector as claimed in claim 10, wherein the endpiece of each of said terminals extends in horizontal.

* * * * *